US007117640B2

(12) United States Patent
Hurzeler

(10) Patent No.: US 7,117,640 B2
(45) Date of Patent: Oct. 10, 2006

(54) RADIO FREQUENCY SHIELDED AND ACOUSTICALLY INSULATED DOOR

(75) Inventor: Peter Hurzeler, Buchsweg (CH)

(73) Assignee: Imedco AG, Hagendorf (CH)

( * ) Notice: Subject to any disclaimer, the term of this patent is extended or adjusted under 35 U.S.C. 154(b) by 42 days.

(21) Appl. No.: 10/315,471

(22) Filed: Dec. 10, 2002

(65) Prior Publication Data

US 2003/0167697 A1    Sep. 11, 2003

Related U.S. Application Data

(63) Continuation of application No. 09/702,454, filed on Oct. 31, 2000, now Pat. No. 6,519,899.

(51) Int. Cl.
*E06B 3/00* (2006.01)

(52) U.S. Cl. .................................. 49/501; 52/784.1

(58) Field of Classification Search ............... 49/501, 49/484.1; 52/173.1, 207, 204.1, 784.1; 174/35 R, 174/35 MS; 428/328, 329, 330
See application file for complete search history.

(56) References Cited

U.S. PATENT DOCUMENTS

| 1,789,827 | A | | 1/1931 | McKay |
| 2,440,763 | A | | 5/1948 | Todhunter |
| 3,557,777 | A | | 1/1971 | Cohen |
| 3,697,728 | A | * | 10/1972 | Stirzenbecher ............. 219/548 |
| 3,934,066 | A | * | 1/1976 | Murch ....................... 442/221 |
| 3,948,295 | A | * | 4/1976 | Lemont et al. ............ 138/147 |
| 3,987,588 | A | | 10/1976 | Imperial et al. |
| 4,033,827 | A | * | 7/1977 | White, Jr. ................. 202/248 |
| 4,084,347 | A | | 4/1978 | Brown |
| 4,370,831 | A | | 2/1983 | Hamilton |
| 4,471,212 | A | * | 9/1984 | Hager, Jr. ................. 392/435 |
| 4,478,018 | A | * | 10/1984 | Holand ..................... 52/220.1 |
| 4,507,520 | A | | 3/1985 | Lindgren |
| 4,561,209 | A | | 12/1985 | Söhlstrom |
| 4,590,710 | A | * | 5/1986 | Newland .................... 49/478.1 |
| 4,613,820 | A | | 9/1986 | Edelstein et al. |
| 4,642,416 | A | | 2/1987 | Rogner |
| 4,651,099 | A | | 3/1987 | Vinegar et al. |
| 4,662,288 | A | * | 5/1987 | Hastings et al. ................ 109/2 |
| 4,691,483 | A | | 9/1987 | Anderson |
| 4,716,683 | A | * | 1/1988 | Minter ....................... 49/479.1 |
| 4,742,107 | A | | 5/1988 | Statz |
| 4,746,765 | A | * | 5/1988 | Mallott ................... 174/35 GC |
| 4,755,630 | A | | 7/1988 | Smith et al. |
| 4,786,758 | A | | 11/1988 | Zielinski |
| 4,794,206 | A | | 12/1988 | Weinstein |
| 4,831,780 | A | | 5/1989 | Bockwinkel |
| 4,889,124 | A | | 12/1989 | Schneider |
| 4,894,489 | A | | 1/1990 | Takahashi et al. |

(Continued)

OTHER PUBLICATIONS

IMEDCO Protective Shielding for MRI Equipment-brochure written by Imedco, published date unknown.

(Continued)

*Primary Examiner*—Jerry Redman
(74) *Attorney, Agent, or Firm*—Bell, Boyd & Lloyd LLC

(57) ABSTRACT

A door for a RF shielded and acoustically insulated room. The door includes a door panel and door frame adapted to electrically and pivotally contact the door panel. The door panel includes a noise absorbing material and a noise insulating gap disposed between outer sections of the door panel. The door frame includes a noise absorbing material and a perforated region adjacent to the noise absorbing material. The perforated region includes a number of apertures spaced apart at varying distances along the door frame.

36 Claims, 6 Drawing Sheets

U.S. PATENT DOCUMENTS

| | | | |
|---|---|---|---|
| 4,910,920 A | | 3/1990 | Nichols |
| 4,924,969 A | * | 5/1990 | L'Heureux .................. 181/290 |
| 4,929,802 A | | 5/1990 | Schaepers et al. |
| 4,932,180 A | | 6/1990 | Takahashi et al. |
| RE33,256 E | | 7/1990 | Busby |
| 4,941,207 A | | 7/1990 | Maeda et al. |
| 4,953,324 A | | 9/1990 | Herrmann |
| 4,959,504 A | | 9/1990 | Yarger et al. |
| 4,965,408 A | * | 10/1990 | Chapman et al. ...... 174/35 MS |
| 4,982,053 A | | 1/1991 | Thornley et al. |
| 5,013,869 A | | 5/1991 | Breithaupt |
| 5,017,736 A | | 5/1991 | Yarger et al. |
| 5,028,739 A | * | 7/1991 | Keyser et al. ......... 174/35 GC |
| 5,043,529 A | | 8/1991 | Vanesky et al. |
| 5,045,636 A | | 9/1991 | Johnasen et al. |
| 5,063,273 A | | 11/1991 | Bloks |
| 5,081,071 A | | 1/1992 | Hirschkoff |
| 5,120,087 A | | 6/1992 | Pastva |
| 5,167,098 A | | 12/1992 | Blackwelder |
| 5,197,225 A | | 3/1993 | Yff |
| 5,198,286 A | * | 3/1993 | Kagoshima et al. ........ 442/370 |
| 5,214,241 A | * | 5/1993 | Benwell ............... 174/35 GC |
| 5,223,670 A | | 6/1993 | Hogan et al. |
| 5,241,132 A | | 8/1993 | McCormack |
| 5,335,464 A | | 8/1994 | Vanesky et al. |
| 5,353,029 A | * | 10/1994 | Johnston et al. ................ 342/4 |
| 5,361,552 A | | 11/1994 | Fulford |
| 5,371,987 A | | 12/1994 | Hirsch et al. |
| 5,417,029 A | * | 5/1995 | Hugus et al. ............... 52/792.1 |
| 5,452,550 A | | 9/1995 | Vanesky et al. |
| 5,510,575 A | | 4/1996 | Weibler |
| 5,522,195 A | * | 6/1996 | Bargen ........................ 52/455 |
| 5,544,452 A | | 8/1996 | Fujita et al. |
| 5,569,878 A | | 10/1996 | Zielinski |
| 5,583,318 A | | 12/1996 | Powell |
| 5,595,801 A | | 1/1997 | Fahy et al. |
| 5,603,196 A | | 2/1997 | Söhlstrom |
| 5,613,330 A | | 3/1997 | Perälä et al. |
| 5,638,896 A | * | 6/1997 | Nishino et al. ............. 165/132 |
| 5,712,038 A | * | 1/1998 | Yamazaki et al. ....... 428/411.1 |
| 5,736,671 A | | 4/1998 | Perälä et al. |
| 5,749,178 A | * | 5/1998 | Garmong ..................... 52/79.1 |
| 5,755,062 A | | 5/1998 | Slater |
| 5,777,279 A | * | 7/1998 | Parker et al. ............... 181/287 |
| 5,786,547 A | | 7/1998 | Zielinski |
| 5,908,043 A | | 6/1999 | Paes et al. |
| 6,068,009 A | * | 5/2000 | Paes et al. .................. 135/117 |
| 6,085,865 A | | 7/2000 | Delverdier et al. |
| 6,112,496 A | * | 9/2000 | Hugus et al. ............ 52/784.11 |
| 6,119,411 A | * | 9/2000 | Mateu Gil et al. ........... 52/79.1 |
| 6,145,617 A | * | 11/2000 | Alts ............................ 181/290 |
| 6,170,203 B1 | | 1/2001 | Schlapfer |
| 6,282,848 B1 | | 9/2001 | Schlapfer |

OTHER PUBLICATIONS

IMEDCO Custom RF Window Options written by Imedco, published date unknown.

PRB Gyroscan written by Philips Medical Systems, published in 2000.

Architectural/Installation Planning Use Only written by GE Medical System, published in GE Medical System, published date unknown.

Magnetically shielded rooms in diagnostics and semi-conductor technology written by Karl-Jürgen Best, Jochen Bork, published Edition Feb. 1991.

Heavily Magnetically Shielded Room For Measurements of Extremely Weak Magnetics Fields written by A. Mager, L. Borek, published date unknown.

Superconducting Shield For Biomagnetism Measurement Coupled With Ferro-Magnetic written by H. Matsuba, D. Irisawa, A. Yahara, published date unknown.

A Two-Shell Magnetically Shielded Room For Magnetophysiology written by Y. Okada, B. Shah, published date unknown.

High Tc Superconducting Magnetic Shields For Biomagnetic Applications written by Y. Shimbo, K. Nakada, K. Niki, M. Kabasawa, Y. Uchikawa, M. Kotani, published date unknown.

A Clinically Oriented Shielded Facility For Biomagnetism written by R.J.P. Bain, G.B. Donaldson, C.M. Pegrum, P. Mass, A.I. Weir, published date unknown.

Designing and Inspecting System of Prefabricated Magnetically Shielded Room For Biomagnetism written by K. Okuda, J. Takeuchi, M. Mukai, S. Kuriki, Y. Uchikawa, M. Kotani, published date unknown.

Shielding Factor of the Box-Shaped MSR for SQUID Measurement written by N. Ishikawa, N. Kasai, H. Kado, published date unknown.

Magnetically Shielded Rooms for Biomagnetic Investigations written by Vacuumschmelze GmbH, published date unknown.

Understanding Shielding written by James. P. Antonic, published date unknown.

Design, Construction, and Performance of a Large-Volume Magnetic Shield written by Vaino O. Kelha, Jussi M. Pukki, Risto S. Peltonen, Auvo J. Penttinen, Risto J. Ilmonimi, and Jarmo J. Heino, published in Jan. 1982.

Prefabricated Magnetically Shielded Room Literature written by Takenaka Corporation, published date unknown.

Noise Reduction and Sound Attention Properties (website) written by www.steelceilings.com, printed Oct. 24, 2001.

Guymark® UK (website) written by www.guymark.com, printed Oct. 24, 2001.

Shielding Insights (website) written by www.lindgrenrf.com, printed Jan. 30, 2002.

Shielding Insights (newsletter) written by Lindgreen RF Enclosures, Inc., published 1999.

* cited by examiner

RADIO FREQUENCY SHIELDED AND ACOUSTICALLY INSULATED DOOR

PRIORITY CLAIM

This application is a continuation of and claims the benefit of priority to U.S. patent application Ser. No. 09/702,454, filed Oct. 31, 2000 now U.S. Pat. No. 6,514,899.

DESCRIPTION

This invention relates in general to a radio frequency ("RF") shielded and acoustically insulated door for shielding enclosures, and more particularly to a RF shielded and acoustically insulated door which improves the attenuation characteristics of the RF shielded room and improves the acoustic insulation of equipment therein.

BACKGROUND OF THE INVENTION

The power of magnetic resonance imaging ("MRI") equipment is continually increasing to meet the demand in the medical community for better and faster images. However, as the power of MRI equipment increases, an increased amount or level of audible noise is generated due, in part, to the coil assembly of the MRI equipment. As a result, the level of noise may increase to the extent that it exceeds health and safety regulatory and industry standards which seek to protect the worker from increased noise levels. Such MRI equipment must, therefore, be properly contained within a RF shielded and acoustically insulated room to protect the MRI equipment from stray electromagnetic radiation and to protect the medical staff or operators of the equipment from continuous undesirable noise levels.

An important feature of the RF shielded and acoustically insulated room is the door. While having to fulfill its primary task of shielding RF fields and insulating noise, the door must also be easy to operate, durable and aesthetically pleasing to operators and patients. Attempts have been made to address the problem of providing a door which acts to shield RF fields and insulate noise without compromising its performance. For example, U.S. Pat. No. 4,794,206 to Industrial Acoustics Company, Inc. is directed to a room that is RF shielded and acoustically insulated. The room includes a door that is acoustically sealed by acoustic seals associated the door frame.

It is desirable to provide improved RF shielded and acoustically insulated doors which have higher attenuation characteristics and better noise insulation capabilities.

SUMMARY OF THE INVENTION

The present invention provides an improved door construction for a RF shielded and acoustically insulated room. In general, the door includes a door frame and door panel that is pivotally and conductively connected to the door frame. The door panel includes outer sections and a noise absorbing material that is disposed between the outer sections such that the door panel provides greater acoustic insulation. The acoustic insulating properties of the door panel are further enhanced by a noise insulating gap.

The frame includes a frame noise absorbing material and a frame perforated region. The frame perforated region includes a number of apertures or perforations that are adjacent to the frame noise absorbing material for enabling sound to more easily pass through this region and be absorbed by the noise absorbing material.

The coaction between the acoustically insulating properties of the door frame and door panel effectively enhance the overall acoustic insulating capabilities of the door.

It is therefore an object of the present invention to provide a RF shielded and acoustically insulated door for a RF shielded room.

Other objects, features and advantages of the present invention will be apparent from the following detailed disclosure, taken in conjunction with the accompanying sheets of drawings, wherein like reference numerals refer to like parts, elements or components.

DETAILED DESCRIPTION OF THE INVENTION

Figure 1:
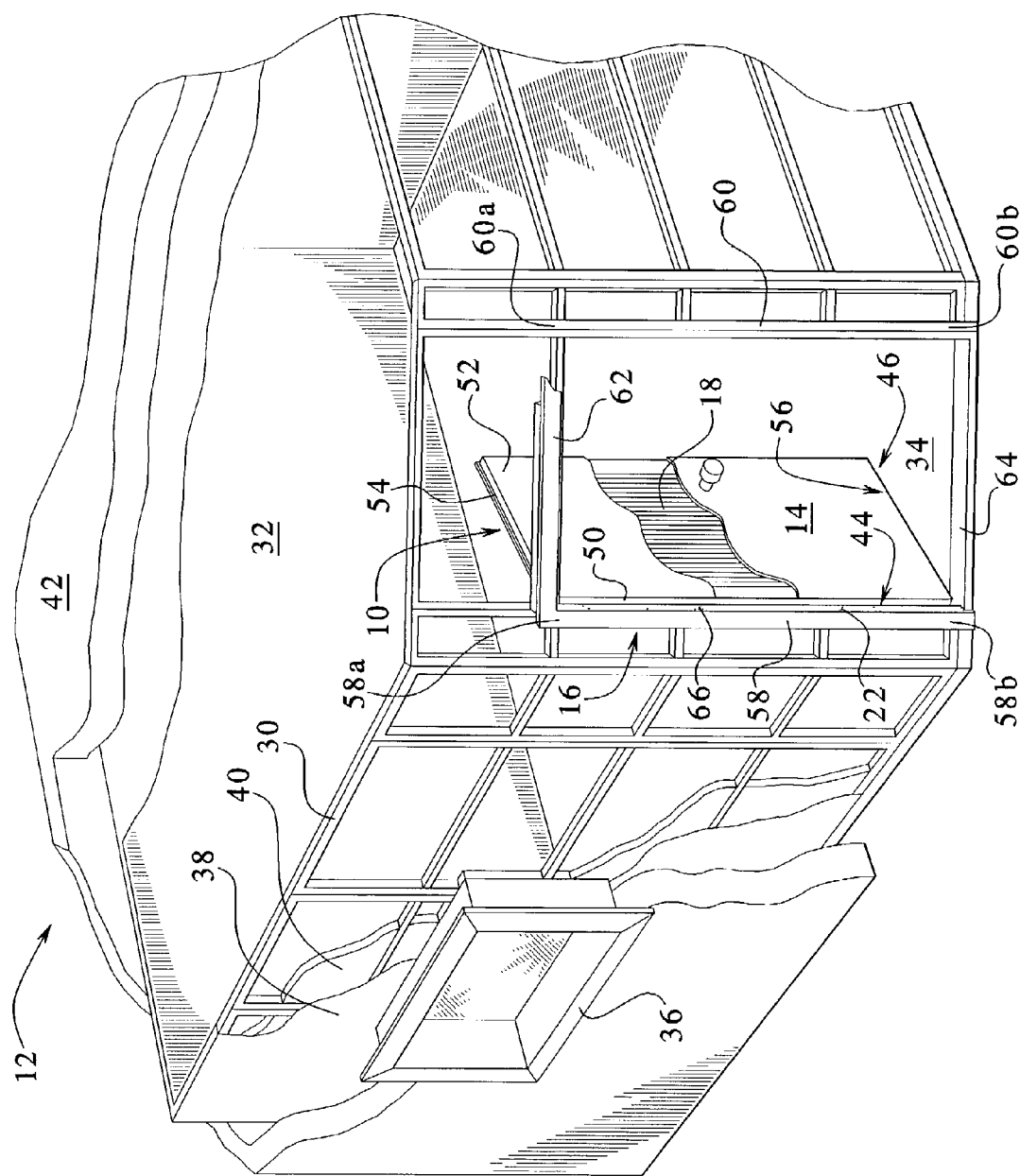
FIG. 1 is a cut-away fragmentary perspective view of an RF shielded room, having an RF shielded and acoustically insulated door of the present invention, which illustrates the absorbing material of the door panel in a cut-away section and the perforations along the inner edge of the door frame.

Referring now to the drawings, and particularly to FIGS. 1 to 4, the present invention includes a RF shielded and acoustically insulated door 10 for an enclosure 12. The door 10 includes a door panel 14 and door frame 16 that each include RF shielding and acoustically insulating characteristics as discussed below. It should be appreciated that the noise insulating features of the present invention could be employed with different RF shielding structure or constructions.

Figure 2:
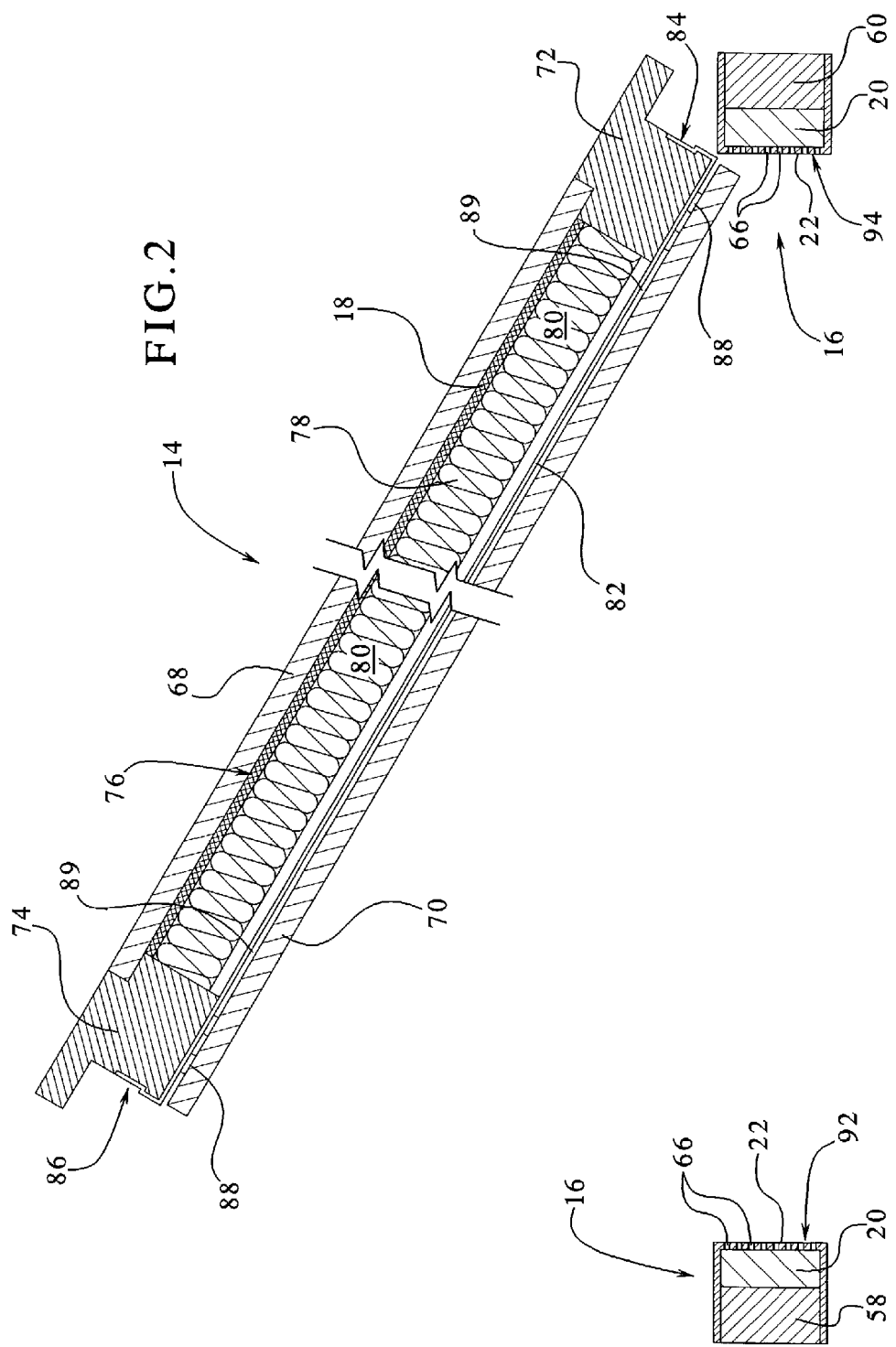
FIG. 2 is a horizontal cross-sectional view of the door panel and the frame of the present invention.
Figure 3:
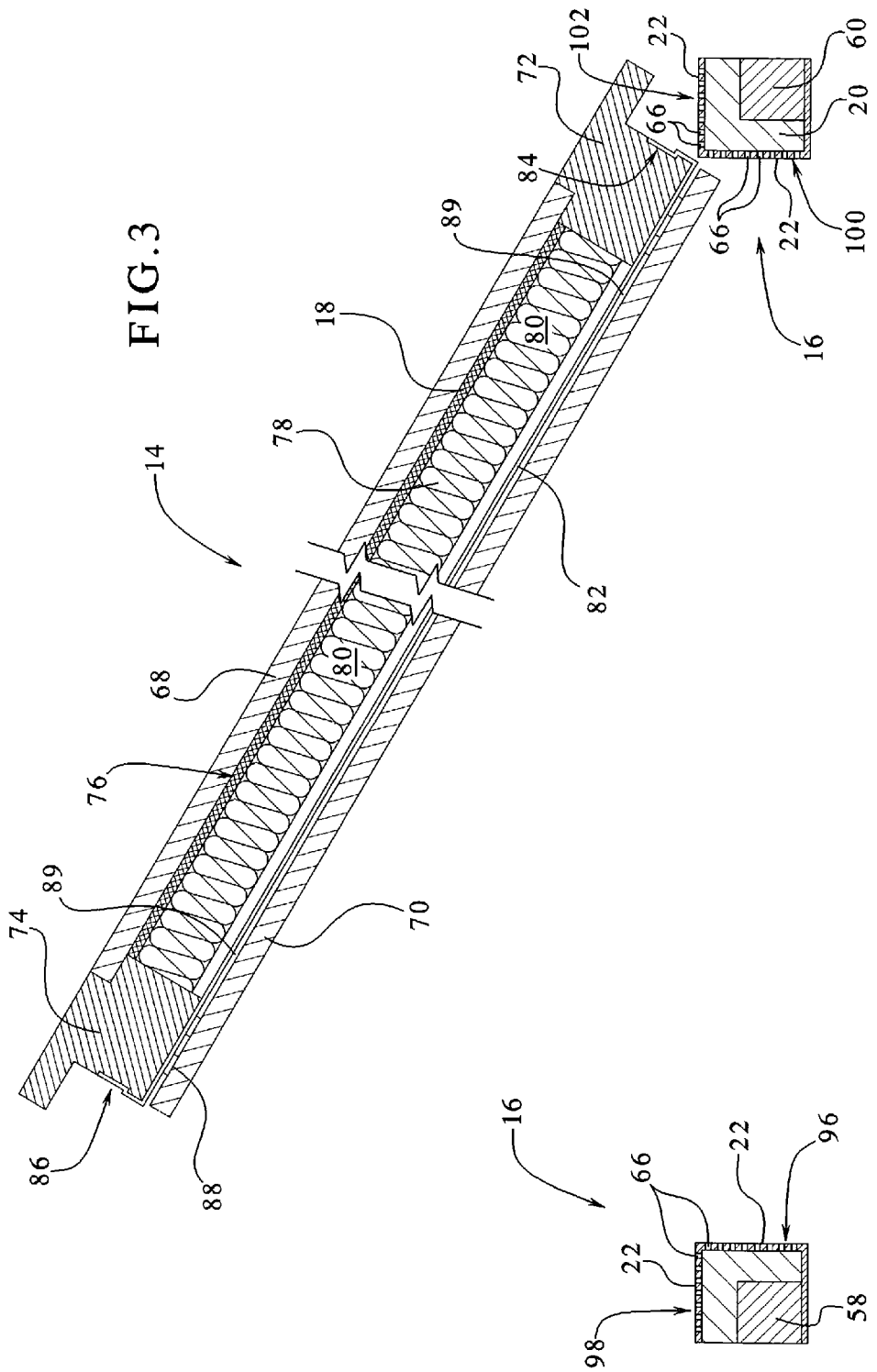
FIG. 3 is a horizontal cross-sectional view of the door panel and the frame illustrating an alternative embodiment of the perforated region of the frame.
Figure 4:
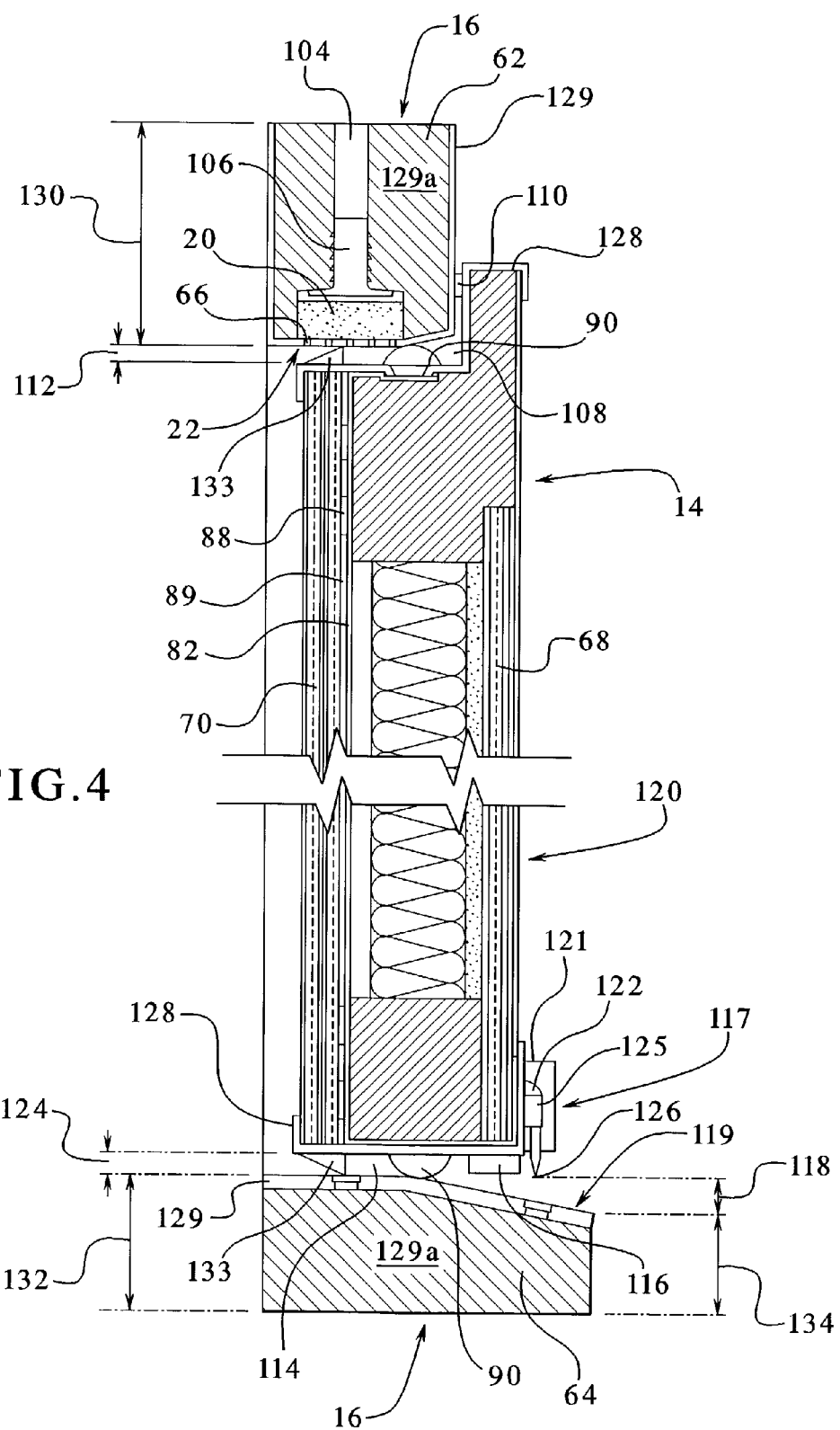
FIG. 4 is a vertical cross-sectional view of the door panel and the frame of the first embodiment of the present invention.

As shown in FIG. 1, the acoustically insulating properties of the door panel 14 include a noise absorbing material 18 disposed within the door panel 14. As described below, the door panel 14 further provides acoustic insulation by including a noise insulating gap (as illustrated FIGS. 2 to 4). As further illustrated in FIG. 1, the door frame 16 includes a noise absorbing material 20 (as illustrated in FIGS. 2 to 4) adjacent to a perforated region 22. The door panel 14 and door frame 16 also include an RF shielding material as discussed below. The coaction of the acoustically insulating and RF shielding characteristics of the door panel and door frame effectively enhance the overall acoustically insulating and RF shielding properties of the door 10.

In FIG. 1, the door 10 is shown attached to the room or enclosure 12 in an opened position. The door 10 preferably opens into the room 12. However, the door 10 can be configured to open away from the room 12.

While the door 10 is a critical component of the acoustical noise insulated and RF shielded room 12, other components, such as, the walls 30, ceiling 32, floor 34 and windows 36, are also necessary to ensure that the room 12 effectively shields RF fields and insulates noise. In general, the floor 34 supports the walls 30 which support the ceiling 32. The room 12 can be of a variety of different constructions and configurations including a number of different sizes and dimensions.

For example, the RF shielded and noise insulated room 12 is preferably constructed for housing MRI equipment (not shown). However, the room 12 can be configured to house a variety of other equipment, such as scientific and data processing equipment which require protection from stray electromagnetic radiation.

To protect the equipment from stray electromagnetic radiation, the room 12 includes a RF shield layer 38 of a conductive material so as to provide RF shielding. This material is metal, and preferably copper. The room 12 also includes an acoustic noise insulation layer 40. The acoustic noise insulation layer 40 can include a variety of different and suitable acoustic noise insulating materials as further discussed below. The room 12 further includes windows 36 of any suitable size and location for monitoring the equipment in the room or enclosure 12. The windows 36 are spaced at various locations along the walls 30 as further illustrated in FIG. 1. The room or enclosure 12 may include an outer shell 42 in order to protect the components of the room 12, such as the acoustic insulating and RF shielding material layers. The outer shell 42 can include a variety of different and suitable materials.

As previously discussed, the door 10 is shown in the open position as it hangs from its frame 16 as shown in FIG. 1. The frame 16 is attached to a section of the wall 30. In the open position, the door 10 preferably exposes a door hinge mechanism 44. The door hinge mechanism 44 extends along a length of the door 10 so as to facilitate the opening and closing of the door. The door hinge mechanism 44 can be any suitable hinge mechanism.

In the closed position (not shown), a base 46 of the door 10 is flush to a threshold of the door frame 16. The threshold is preferably configured such that it has a inclined or angled region (as illustrated in FIG. 4) which has a low profile for permitting unhindered passage of wheeled equipment into and out of the room.

The door panel 14 preferably has a rectangular shape with a door width, door length, first side section 50, second side section 52, top section 54, and bottom section 56. The door panel 14 can be constructed in a variety of different sizes and shapes to conform to the size and dimension of the room 12. The door panel 14 preferably has a sandwich or layered design so as to effectively shield RF fields and insulate noise as described below (and illustrated in FIGS. 2 to 4).

The door frame 16 shape and size is only limited to the extent that the door 10 can be properly attached to the room 12 so that it easily operates, insulates noise, and provides RF shielding. The door frame 16 preferably has four door frame sections. It has first side section 58 and second side section 60 that each span a length of the door frame 16 and a top 62 and base 46 or threshold section that each span a length of the door frame 16. The top section 62, first side section 58 and second side section 60 each include a door frame noise absorbing material 20 (as illustrated in FIGS. 2 to 4) so as to effectively insulate noise as discussed below. Each of the top section 62, first side section 58 and second side section 60 include a support material and a conductive material that is attached to the support material. The support material provides strength or structural support for the door frame 16. The attached conductive material layer provides electrical contact or conductivity between the door frame 16 and the door panel 14 so as to facilitate the RF shielding properties of the door 10. As described below, the door frame support material is preferably plywood, and the conductive materials are separately layered in copper and brass. However, a variety of other like support and conductive materials can be used.

As further illustrated in FIG. 1, the first side section 58 and second side section 60 of the door frame 16 include a first region 58a, 60a (respectively) near the top section 62 of the door frame 16, and a second region 58b, 60b (respectively) near the threshold 64 of the door frame 16. The first regions and second regions extend along a portion of the length of the first side section 58 and the second side section 60, respectively.

The first side section 58 and the second side section 60 of the door frame 16 each include a perforated region 22 extending along a portion of the first side section 58 and the second side section 60, preferably the entire length. The perforated region 22 defines a plurality of apertures 66 spaced apart at various distances so as to effectively facilitate noise absorption and insulation as discussed below. The spaced distances preferably vary as between the first regions and the second regions as discussed below. The top section 62 of the door frame 16 also includes a perforated region 22 defining a plurality of apertures 66 as further discussed below.

Turning to FIG. 2, a horizontal sectional view of the door panel 14 and door frame 16 is shown. The door panel 14 has a first outer section 68 and a second outer section 70. These sections are attached to a first side member 72 and a second side member 74 of the door panel 14 so as to define a spaced region 76 between the first outer section 68 and second outer section 70. Both of the first side member 72 and second side member 74 are preferably made of plywood and adapted to fit the door frame such that the door effectively operates to open and close, to insulate noise, and to shield RF fields. The first outer section 68 and second outer section 70 of the door panel 14 are preferably made of plywood.

Within the spaced region 76 of the door panel 14, the door panel noise absorbing layer 18 preferably includes a single layer that is adjacent to the first outer section 68 of the door panel 14. However, the present invention can include a second or additional noise absorbing layers (not shown) adjacent to the second outer section 70. The door panel noise absorbing layer 18 preferably has a thickness of 5 mm and extends along the entire length of the spaced region 76 as defined by the outer sections and side members of the door panel 14. In addition, the door panel noise absorbing layer 18 preferably is a fully bonded insulation foil which is relatively heavy in weight in order to effectively insulate noise.

A cavity 78 of preferably 40 mm in width is adjacent to the door panel noise absorbing layer 18. The cavity 78 contains an amount of insulating material 80 of mineral wool pads, preferably FLUMROC Type 1, a type of rockwool, having a thickness of 30 mm. The added insulating material 80 is further utilized to insulate noise.

Adjacent to the second outer section 70, a layer of conductive material 82 preferably extends along the length of the second outer section 70. This conductive material layer 82 has a first end 84 and second end 86 that each wrap around a portion of a respective side member of the door panel 14 so as to facilitate the RF shielding attenuation of the door. The conductive material layer 82 is preferably copper and has a thickness ranging from 0.14 to 0.21 mm.

A number of spacers 88 are utilized to attach the second outer section 70 to the conductive material layer 82 which wraps around a portion of each of the side members of the door panel as previously discussed. Two spacers are preferably positioned on a section of the conductive material layer 82 adjacent to each of the side members of the door panel 14. Each of the two spacers are preferably spaced apart at a distance of 250 mm between the centers of the spacers. Each of the spacers 88 is preferably made of a PVC material and has dimensions of 0.30×10×2.5 mm.

This configuration, i.e., the second outer section 70 in contact with the conductive material layer 82 via the spacers 88, defines a noise insulating gap 89 in order to further enhance the acoustically insulating properties of the door panel 14. The noise insulating gap 89 acts as a barrier for noise that is transmitted between the first outer section 68 and the second outer section 70 of the door panel. The acoustic noise insulating gap 89 is preferably an air insulating gap of 2.5 mm as defined by the preferred thickness of each of the spacers 88 as previously discussed.

However, the present invention is not limited to the size, shape and material of the spacers 88 and can include spacers 88 of a variety of different sizes, shapes and suitable materials.

In order to provide continuous RF shielding between the door panel 14 and frame 16, a number of RF shielding contact members 90 or fingers are flexibly mounted onto each of the top section and bottom section of the door panel 14 as shown in FIG. 4. The contact members 90 extend along the length of each of these door panel sections and are positioned adjacent to a respective top section and bottom section of the door frame 16 so as to provide electrical contact between the door frame 16 and door panel 14 when the door 10 is in a closed position. The contact members 90 are preferably flexible and made of beryllium such that an effectively seamless and conductive contact between the door panel 14 and door frame 16 is provided so as to facilitate shielding of RF fields. However, the contact member 90 can be of a variety of other like conductive materials.

As previously discussed, the door frame 16 includes a perforated region 22 defining a plurality of apertures 66 and extending along the top section 62, first side section 58 and second side section 60 of the door frame. As shown in FIG. 2, the perforated region 22 extends along an edge 92 of the first side section 58 and an edge 94 of the second side section. Adjacent to the perforated region 22 is a noise absorbing material 20 as further discussed below.

In an alternative embodiment as shown in FIG. 3, the perforated region 22 can extend along a first edge 96 and second edge 98 of the first side section 58 and a first edge 100 and second edge 102 of the second side section 60 in order to facilitate the passage of air, and thus noise, into contact with the noise absorbing material 20. This noise absorbing material and perforated region could also be positioned in the header of the frame.

It should be appreciated that the door panel 14 can be pivotally attached to either of the first side section 58 (as shown in FIG. 1) or the section side section 60 (as shown in FIGS. 2 and 3).

As shown in FIG. 4, the noise insulation features of the door panel 14 and door frame 16 are illustrated in further detail. Regarding the door frame 16, the acoustic noise insulating or absorbing material 20 is located within a spaced region 104 of the door frame 16 that extends along a length of each of the first side section 58, second side section 60 (not shown) and top side section 62 of the door frame 16. The acoustic noise absorbing material 20 preferably extends along the entire length of each of the first side section 58, second side section 60 and top section 62 of the door frame 16 so as to effectively insulate noise that may be trapped in the gap regions between the door frame 16 and door panel 14 from escaping to the outside environment. However, the acoustic noise absorbing material 20 of the door frame 16 can extend along only a portion of the length of each of the side section and top section of the door frame 16. The acoustic noise absorbing material 20 is preferably a felt material of 30×10 mm dimension with a thickness that is limited only by the dimensions of the spaced region 104 of the door frame 16. Once inserted into the spaced region 104, the door frame acoustic noise absorbing material 20 is preferably secured against a number of apertures or perforations 66 of a perforated region 22 of the door frame 16. The door frame noise acoustic absorbing material 20 is preferably secured by a stopper member 106. The stopper member 106 is preferably a plastic material but can be of a variety of other like materials so as to effectively secure the acoustic noise absorbing material 20 against the perforated region 22.

In addition to the acoustic noise absorbing layers of the door panel 14 and door frame 16, the present invention also includes a number of seal members that can act in series so as to further insulate the gap regions between the door panel 14 and door frame 16 such that noise does not escape from the gap regions and into the outside environment. Regarding the gap 108 between the top sections of the door panel 14 and door frame 16, a first seal member 110 is attached to the door frame 16 such that the gap 108 between the door panel 14 and door frame 16 section is effectively closed. The gap 108 preferably extends a distance 112 of 4.5 mm. The first seal member 110 is preferably an adhesive rubber seal Type MAAG EPM P-Profil with dimensions of 9×5.5 mm.

In the gap region 114 between the bottom sections of the door frame 16 and panel 14, a second seal member 116 acts to insulate the gap 114 from noise. The gap 114 preferably has a distance 118 of 10 mm between the bottom sections of the door panel 14 and door frame 16 at an inclined region 119 of the threshold 64. The gap 114 varies in distance across the threshold 64 and has a preferable distance 124 of 5.5 mm at an end opposite of the inclined region 119. The second seal 116 member is preferably a felt material with dimensions of 15×5 mm. However, the first seal member 110 and second seal member 116 can be made of a variety of materials and located in a variety of different positions so as to effectively seal and insulate the gap regions between the door frame 16 and panel 14. For example, the seal member 110 and the seal member 116 can form a seamless seal around at least a portion of the door.

In addition to the first seal member 110 and second seal member 116, the present invention includes a third seal member 117 that is attached to an outer surface 120 of the door panel 14. The third seal member 117 includes an angled member 121 that has an arm which preferably is directed to the bottom of the door frame 16. The angled member 121 is preferably a brass material and has dimensions of 25×10×2 mm. The third seal member 117 further includes a scrapper seal member 122 that is attached to a spacer member 125 of the angled member 121 and to the outer surface so as to effectively secure the scrapper seal member 122. The scrapper seal member 122 includes a gasket member 126 that extends to and contacts the bottom of the door frame 16. The scrapper seal member 122 is preferably a seal Type HEBCO.

A further seal member 133 can be attached to the door panel 14 which can also provide a seamless seal around the door.

As further illustrated in FIG. 4, the door panel 14 includes a layer of conductive material 128 that is attached to the top section, bottom section, first side section (not shown) and second side section (not shown) of the door panel 14. The layered conductive material 128 extends along a portion of each of these sections. This layered material 128 is preferably brass. However, the layered material 128 can include a variety of other like material so as both to provide structural support and to facilitate conductive contact between the door panel 14 and door frame 16. The layered material 128 has a thickness of preferably 1.8 mm. However, the layered material 128 along the bottom section of the door panel (i.e., adjacent to the threshold) is preferably 4.0 mm gauge brass.

The door frame 16 includes a conductive material 129 to further facilitate the conductive connection between the door frame 16 and door panel 14. The conductive material 129 is attached to each of the four sides of the door frame 16. As shown in FIG. 4, the conductive material is attached to the top side 62 and bottom side 64 of the door frame 16. The conductive material is preferably brass but can include a variety of other like conductive materials. The conductive material 129 has a greater thickness at the bottom side 64 than top side 62 of the door frame 16. The conductive material 129 is attached to an outer layer 129a of the door frame 16. As shown in FIG. 4, the outer layer 129a is preferably copper but can include a variety of other like materials. The conductive material 128 and outer layer 129a are attached to a structural material (not shown), preferably of plywood so as to provide structural support to the door frame 16.

As further illustrated in FIG. 4, the top 62 section and bottom section 64 sections of the door frame 16 each include a specified thickness. The top section 62 has a thickness 130 preferably of 60 mm. The bottom or threshold 64 section has a first 132 thickness of preferably 37 mm and a second thickness 134 of preferably 27 mm at the inclined region 119 of the threshold 64. These sections of the door panel 14 and door frame 16 are pivotally attached via a joint member (not shown) so as to facilitate the door operation.

Figure 5A:
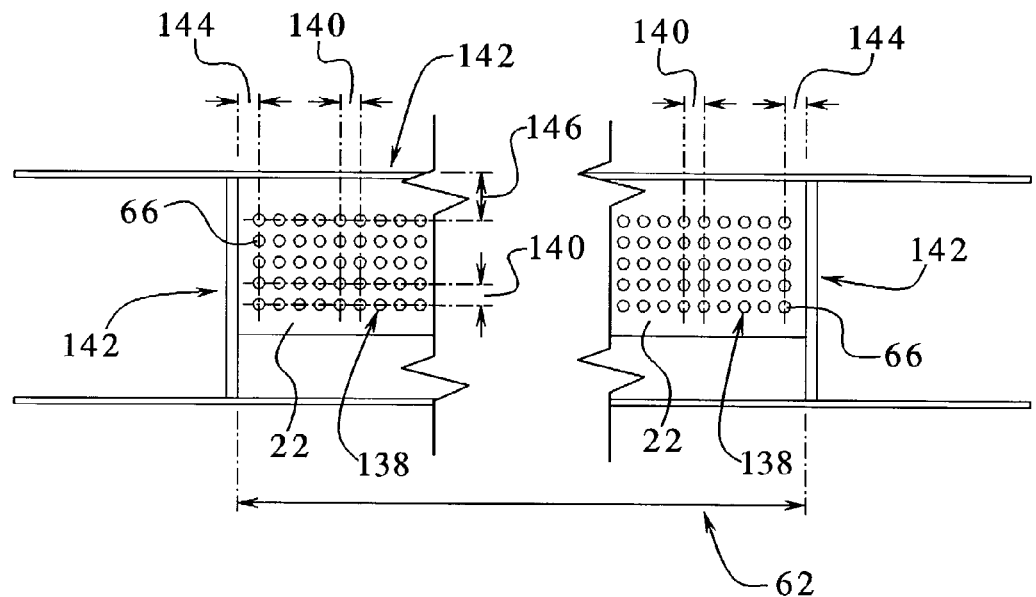
FIG. 5A is an enlarged fragmentary bottom plan view of the top of the door frame illustrating the door frame perforations therein.
Figure 5B:
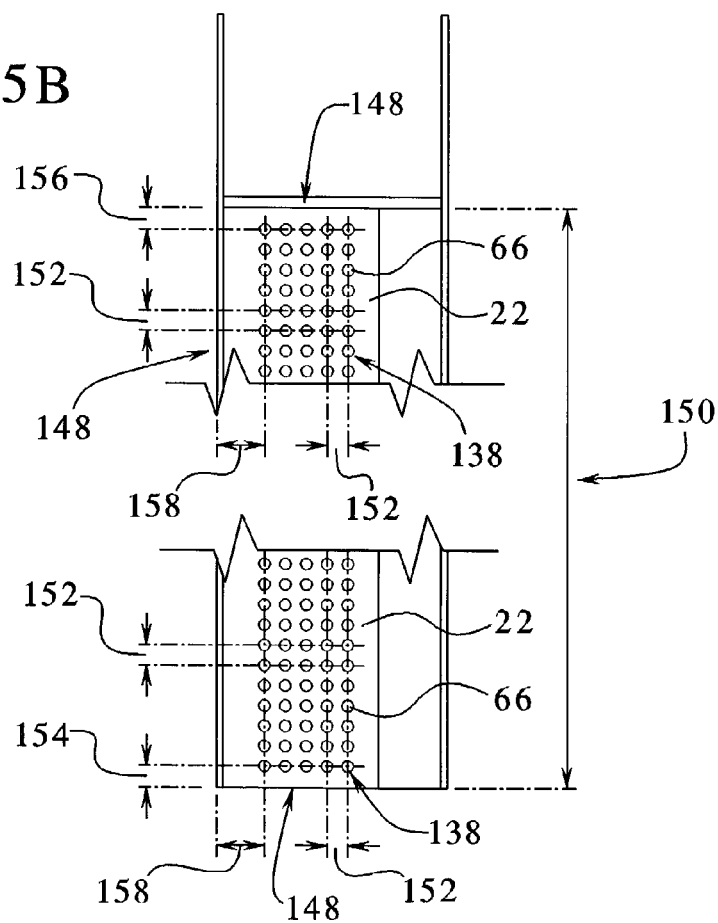
FIG. 5B is an enlarged fragmentary elevational view of the side of the door frame illustrating the door frame perforations therein.

As further illustrated in FIGS. 5A and 5B, the number of apertures or perforations 66 of the perforated region 22 of the door frame 16 are positioned at various locations along each of the first side section 58, second side section 60 and top section 62 of the door frame 16. Along each of these sections, the apertures 66 are preferably 3.0 mm in diameter 138. As shown in FIG. 5A, the apertures 66 are preferably spaced apart at a distance 140 of 5.33 mm in a direction along a width and length of the top section 62. The apertures 66 are also spaced apart from each of the edges 142 of the top section 62 of the door frame 16. Along these edges, the apertures 66 are preferably spaced apart at a distance 144 of 5.71 mm and a distance 146 of 12.33 mm.

As shown in FIG. 5B, the apertures 66 are spaced along each of the edges 148 by section 150 which is representative of the first side section 58 and second side section 60 of the door frame 16. The distance 152 between each of the apertures 66 is preferably 5.33 mm in a direction along the length and width the section 150. The apertures 66 are also spaced apart at a distance 154 of 7.0 mm, a distance 156 of 8.67 mm, and a distance 158 of 12.33 mm.

The present invention is not limited to the size, shape, dimension and material make-up of the previously discussed components of the door 10, i.e., the first outer section 68 and the section outer section 70 of the door panel 14. A variety of different materials of varying sizes and shapes may be utilized to effectively provide both RF shielding and acoustic insulation. Although a variety of different materials may be utilized, the inventor has discovered that materials heavier in weight than other like materials are more preferable because the heavy-weighted materials provide enhanced acoustic insulation relative to the light-weighted materials.

For example, the outer sections of the door panel 14 are preferably made of plywood as previously discussed. However, the outer sections of the door panel 14 may also be made of a chipboard material provided that the weight of the chipboard material is comparable to that of plywood. The weight of the chipboard material can be varied, for example, by varying the amount of glue that is utilized to make the material. The weight of the chipboard increases with an increased amount of glue.

By increasing the weight of the chipboard to a weight that is heavier than plywood or other light-weighted chipboard of the same size and shape, it should be appreciated that the heavier-weighted chipboard is more preferable than the plywood or other light-weighted chipboard because of its enhanced effect on the acoustic insulating properties of the door 10 due to its increased weight. It should also be appreciated that the acoustic insulating characteristics of the door can be adjusted by varying the other materials, and dimensions thereof.

It should be appreciated that the present invention is not limited to the size, dimension and location of the apertures 66 of the perforated region 22. The apertures 66 can include a variety of different sizes, shapes and locations in order to facilitate the acoustic insulating properties of the door 10.

Noise Insulation Performance Test

The assignee of the present invention conducted noise insulation performance tests on a prototype of the door of the present invention. In order to determine the noise insulation effectiveness of the door, the entire door assembly was mounted in an opening between two laboratories, i.e., the transmitter and receiver rooms. The dimensions of the opening were 2000×900 mm. The junction between the door assembly and the edges of the opening was sealed with putty. Alternative routes for noise to be transferred between the transmitter and receiver rooms were sufficiently attenuated to make their influence on the results insignificant.

To measure the suppression of airborne noise, a loudspeaker in the transmitter room transmitted noise in thirds in a frequency range of 80 Hz to 5000 Hz. The noise levels L1 in the transmitter room and L2 in the receiver room were measured using a high-precision noise level meter. A condenser microphone which was moved through the room acted as a converter.

A noise suppression R according to ISO 717-1982 was calculated from the following formula:

$$R = L1 - L2 + 10 \log (S/A2) \ (dB)$$

where:

L1 represents airborne noise level in the transmitter room (dB); L2 represents airborne noise levels in the receiver room (dB); S represents the area of the door under test (m$^2$); and A2 represents the equivalent noise absorbing area of the receiver room (m$^2$).

Figure 6:
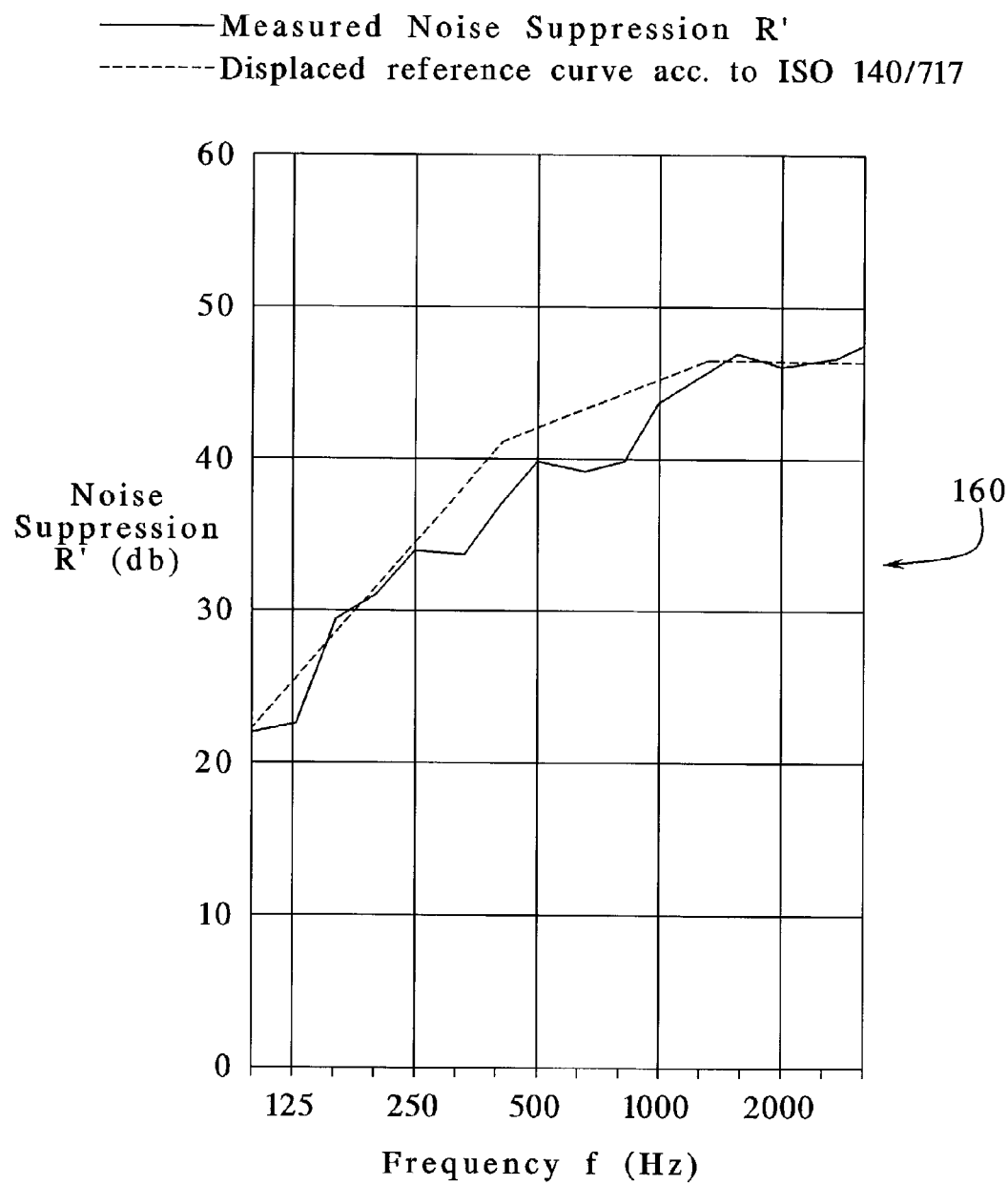
FIG. 6 is a graph illustrating the noise suppression values with respect to frequency exhibited by the door resulting from tests performed by the assignee of the present invention.

The performance test results are depicted in graphical form 160 in FIG. 6. The graph shows a plot of the results of the noise suppression or insulation measurements in relation to frequency. The effective value calculated from the measurements is: Rw=42 dB. The maximum permissible variation is 4.1 dB at 800 Hz. The results are shown in tabular format below:

| Noise Suppression R' (dB) | Frequency (Hz) |
|---|---|
| 22.7 | 100 |
| 23.2 | 125 |
| 29.6 | 160 |
| 31.6 | 200 |
| 34.3 | 250 |
| 34.0 | 315 |
| 37.4 | 400 |
| 39.8 | 500 |
| 39.3 | 630 |
| 39.9 | 800 |
| 43.4 | 1000 |
| 45.2 | 1250 |
| 46.7 | 1600 |
| 45.9 | 2000 |
| 46.1 | 2500 |
| 47.1 | 3150 |

The performance test results demonstrate the effectiveness of the acoustically insulating capabilities of the door of the present invention. As previously discussed, the door's acoustically insulating capabilities are effectively enhanced by the coaction of the acoustically insulating properties of the door panel and door frame.

It will be understood that modifications and variations may be effected without departing from the scope of the novel concepts of the present invention, and it is understood that this application is to be limited only by the scope of the appended claims.

The invention is claimed a follows:

1. A RF shielded and acoustically insulated room door panel, the door panel comprising:
   a first outer section;
   a second outer section;
   a first side member extending along a side edge of the first outer section;
   a second side member extending along an opposite side edge of the first outer section;
   said first and second side members having inner surfaces facing each other and outer surfaces facing opposing directions, said outer surfaces facing away from the first outer section;
   an acoustic noise absorbing layer disposed between the first outer section and the second outer section; and
   a RF shielding layer disposed between the first outer section and the second outer section, wherein the RF shielding layer is positioned adjacent to and spaced apart from one of the first outer section and the second outer section thereby defining an acoustic noise insulating air gap free of insulation between the RF shielding layer and one of the first outer section and the second outer section, said RF shielding layer extending to the outer surfaces of the first and second side members.

2. The door panel of claim 1, wherein the acoustic noise absorbing layer includes a first acoustic noise absorbing layer positioned adjacent to the first outer section.

3. The door panel of claim 2, wherein the first acoustic noise absorbing layer includes a fully bonded insulation foil material.

4. The door panel of claim 2, wherein the acoustic noise absorbing layer includes a second acoustic noise absorbing layer positioned adjacent to the first acoustic noise absorbing layer.

5. The door panel of claim 4, wherein the second acoustic noise absorbing layer includes a mineral wool material.

6. The door panel of claim 1, wherein the RF shielding layer includes a conductive layer including a copper material.

7. A RF shielded and acoustically insulated room door panel, the door panel comprising:
   a first outer section;
   a second outer section;
   a first side member extending along a side edge of the first outer section;
   a second side member extending along an opposite side edge of the first outer section;
   said first and second side members having inner surfaces facing each other and outer surfaces facing in opposing directions, said outer surfaces facing away from the first outer section; and
   a plurality of layers disposed between and connecting the first outer section and the second outer section, the layers including an acoustic noise absorbing layer and a RF shielding layer spaced apart from the second outer section via a plurality of spacers thereby defining an acoustic noise insulating air gap free of insulation between the RF shielding layer and the second outer section, said RF shielding layer extending to the outer surfaces of the first and second side members.

8. The door panel of claim 7, wherein the acoustic noise absorbing layer includes a first acoustic noise absorbing layer positioned adjacent to the first outer section.

9. The door panel of claim 8, wherein the first acoustic noise absorbing layer includes a fully bonded insulation foil material.

10. The door panel of claim 8, wherein the acoustic noise absorbing layer includes a second acoustic noise absorbing layer positioned adjacent to the first acoustic noise absorbing layer.

11. The door panel of claim 10, wherein the second acoustic noise absorbing layer includes a mineral wool material.

12. The door panel of claim 7, wherein the RF shielding layer includes a conductive layer including a copper material.

13. A RF shielded and acoustically insulated room door panel wherein the door panel is capable of being pivotally and conductively connected to a door frame thereby defining an air gap region between the door panel and the door frame, the door panel comprising:
   a first outer section;
   a second outer section;
   a first side member extending along a side edge of the first outer section;
   a second side member extending along an opposite side edge of the first outer section;
   said first and second side members having inner surfaces facing each other and outer surfaces facing in opposing directions, said outer surfaces facing away from the first outer section and toward opposite edges of the door frame;
   an acoustic noise absorbing layer disposed between the first outer section and the second outer section;
   a RF shielding layer disposed between the first outer section and the second outer section and wherein the RF shielding layer is positioned adjacent to and spaced apart from one of the first outer section and the second outer section thereby defining an acoustic noise insulation air gap free of insulation between the RF shielding layer and one of the first outer section and the second outer section, said RF shielding layer extending to the outer surfaces of the first and second side members; and at least one seal member attached to the door panel, whereby the seal member acts to insulate acoustic noise from escaping the air gap region.

14. The door panel of claim 13, wherein the seal member includes a first seal member and a second seal member that act to provide a seamless seal around at least a portion of the door panel positioned within the air gap region.

15. The door panel of claim 14, wherein the first seal member includes a rubber material and the second seal member includes a felt material.

16. The door panel of claim 15, wherein the seal member includes a third seal member that includes a gasket material.

17. The door panel of claim 16, wherein the seal member includes a fourth seal member that acts to provide an additional seamless seal within at least a portion of the air gap region.

18. The door panel of claim 13, wherein the acoustic noise absorbing layer includes a first acoustic noise absorbing layer that includes a fully bonded insulation foil material positioned adjacent to the first outer section.

19. The door panel of claim 18, wherein the acoustic noise absorbing layer includes a second acoustic noise absorbing layer that includes a mineral wool material positioned adjacent to the first acoustic noise absorbing layer.

20. The door panel of claim 13, wherein the RF shielding layer includes a conductive layer including a copper material.

21. The door panel of claim 20, wherein the conductive layer is spaced apart from the second outer section via a plurality of spacers attached to the conductive layer and the second outer section, thereby defining the acoustic noise insulating air gap.

22. A RF shielded and acoustically insulated room door panel wherein the door panel is capable of being pivotally and conductively connected to a door frame thereby defining an air gap region between the door panel and the door frame, the door panel comprising:

a first outer section;

a first side member extending along a side edge of the first outer section;

a second side member extending along an opposite side edge of the first outer section;

said first and second side members having inner surfaces facing each other and outer surfaces facing in opposing directions, said outer surfaces facing away from the first outer section and toward opposite edges of the door frame;

an acoustic noise absorbing layer positioned adjacent to the first outer section;

a RF shielding layer positioned adjacent to the acoustic noise absorbing layer, said RF shielding layer extending to the outer surfaces of the first and second side members; and a second outer section positioned adjacent to and spaced apart from the RF shielding layer, thereby defining an acoustic noise insulating air gap free of insulation between the RF shielding layer and the second outer section.

23. The door panel of claim 22, wherein the acoustic noise absorbing layer includes a first acoustic noise absorbing layer positioned adjacent to the first outer section.

24. The door panel of claim 23, wherein the first acoustic noise absorbing layer includes a fully bonded insulation foil material.

25. The door panel of claim 23, wherein the acoustic noise absorbing layer includes a second acoustic noise absorbing layer positioned adjacent to the first acoustic noise absorbing layer.

26. The door panel of claim 25, wherein the second acoustic noise absorbing layer includes a mineral wool material.

27. The door panel of claim 22, wherein the RF shielding layer includes a conductive layer including a copper material.

28. The door panel of claim 27, which further includes a plurality of spacers wherein the second outer section is attached to the conductive layer via the spacers thereby defining the acoustic noise insulating air gap.

29. The door panel of claim 22, which further includes a plurality of seal members disposed within the gap region between the door panel and the door frame, whereby the seal members act to insulate acoustic noise from escaping the air gap region.

30. An RF shielded and acoustically insulated room, said room comprising:

a door frame; and a door panel pivotally and conductively connected to the door frame thereby defining an air gap region between the door panel and the door frame, the door panel including a first outer section, a second outer section, a first side member extending along a side edge of the first out section, a second side member extending along an opposite edge of the first outer section, said first and second side members having inner surfaces facing each other and outer surfaces facing in opposing directions, said outer surfaces facing away from the first outer section and toward opposite edges of the door frame, an acoustic noise absorbing layer disposed between the first outer section and the second outer section, and a RF shielding layer disposed between the first outer section and the second outer section, wherein the RF shielding layer is positioned adjacent to and spaced apart from one of the first outer section and the second outer section thereby defining an acoustic noise insulating air gap free of insulation between the RF shielding layer and one of the first outer section and the second outer section, said RF shielding layer extending to the outer surfaces of the first and second side members.

31. The room of claim 30, wherein the acoustic noise absorbing layer includes a first acoustic noise absorbing layer positioned adjacent to the first outer section.

32. The room of claim 31, wherein the first acoustic noise absorbing layer includes a fully bonded insulation foil material.

33. The room of claim 31, wherein the acoustic noise absorbing layer includes a second acoustic noise absorbing layer positioned adjacent to the first acoustic noise absorbing layer.

34. The room of claim 33, wherein the second acoustic noise absorbing layer includes a mineral wool material.

35. The room of claim 30, wherein the RF shielding layer includes a conductive layer including a copper material.

36. The room of claim 30, which further includes a plurality of seal members disposed within the air gap region between the door panel and the door frame, whereby the seal members act to insulate acoustic noise from escaping the air gap region.

* * * * *